(12) United States Patent
Norichi

(10) Patent No.: US 9,425,763 B2
(45) Date of Patent: Aug. 23, 2016

(54) LONGITUDINALLY-COUPLED-RESONATOR-TYPE SURFACE ACOUSTIC WAVE FILTER

(71) Applicant: Murata Manufacturing Co., Ltd., Nagaokakyo-shi, Kyoto-fu (JP)

(72) Inventor: Takahiro Norichi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 20 days.

(21) Appl. No.: 14/478,137

(22) Filed: Sep. 5, 2014

(65) Prior Publication Data

US 2014/0375397 A1 Dec. 25, 2014

Related U.S. Application Data

(63) Continuation of application No. PCT/JP2013/057369, filed on Mar. 15, 2013.

(30) Foreign Application Priority Data

Mar. 22, 2012 (JP) ................................ 2012-065617

(51) Int. Cl.
*H03H 9/64* (2006.01)
*H03H 9/00* (2006.01)
*H03H 9/145* (2006.01)

(52) U.S. Cl.
CPC ......... *H03H 9/0047* (2013.01); *H03H 9/0057* (2013.01); *H03H 9/14588* (2013.01); *H03H 9/6469* (2013.01)

(58) Field of Classification Search
CPC ............. H03H 9/0047; H03H 9/0052; H03H 9/0057; H03H 9/6433; H03H 9/6456; H03H 9/6463; H03H 9/6466; H03H 9/6469; H03H 9/14588

USPC .................. 333/193, 195; 310/313 B, 313 D
See application file for complete search history.

(56) References Cited

U.S. PATENT DOCUMENTS 5,790,000 A * 8/1998 Dai ...................... H03H 9/0038
   310/313 B
5,835,990 A * 11/1998 Saw ..................... H03H 9/0038
   310/313 B (Continued)

FOREIGN PATENT DOCUMENTS

JP      2004-096244 A      3/2004
JP      2004-140785 A      5/2004

(Continued)

OTHER PUBLICATIONS

Official Communication issued in International Patent Application No. PCT/JP2013/057369, mailed on Apr. 9, 2013.

(Continued)

*Primary Examiner* — Barbara Summons
(74) *Attorney, Agent, or Firm* — Keating & Bennett, LLP

(57) ABSTRACT

A longitudinally-coupled-resonator-type surface acoustic wave filter includes an unbalanced terminal, balanced terminals, a piezoelectric substrate, a first surface acoustic wave filter unit, a second surface acoustic wave filter unit, an unbalanced signal wiring line, balanced signal wiring lines, a pair of interstage wiring lines that connect the first surface acoustic wave filter unit and the second surface acoustic wave filter unit to each other, and ground wiring lines. The first surface acoustic wave filter unit includes a first IDT and a pair of a second IDT and a third IDT. The first IDT includes a pair of first divided comb tooth shaped electrodes obtained by dividing a comb tooth shaped electrode on the side spaced from the unbalanced terminal along a central axis.

13 Claims, 6 Drawing Sheets

(56) References Cited

U.S. PATENT DOCUMENTS

| | | | |
|---|---|---|---|
| 6,353,372 B1* | 3/2002 | Baier | H03H 9/0028 310/313 C |
| 6,469,593 B2* | 10/2002 | Nishizawa | H03H 9/0061 310/313 R |
| 8,031,034 B1* | 10/2011 | Solal | H03H 9/0061 333/193 |
| 2003/0160665 A1* | 8/2003 | Hagn | H03H 9/0028 333/195 |
| 2004/0066254 A1 | 4/2004 | Shibahara | |
| 2004/0080385 A1 | 4/2004 | Takamine et al. | |
| 2005/0212621 A1 | 9/2005 | Takamine | |
| 2007/0018756 A1 | 1/2007 | Fujii et al. | |
| 2007/0182511 A1 | 8/2007 | Takamine | |
| 2007/0279156 A1 | 12/2007 | Pitschi et al. | |
| 2010/0066462 A1 | 3/2010 | Takahara | |
| 2010/0219912 A1* | 9/2010 | Tanaka | H03H 9/0038 333/195 |

FOREIGN PATENT DOCUMENTS

| | | |
|---|---|---|
| JP | 2006-174376 A | 6/2006 |
| JP | 2006-527516 A | 11/2006 |
| WO | 2005/031971 A1 | 4/2005 |
| WO | 2006/009021 A1 | 1/2006 |
| WO | 2006/049000 A1 | 5/2006 |
| WO | 2008/149619 A1 | 12/2008 |

OTHER PUBLICATIONS

Official Communication issued in corresponding Japanese Patent Application No. 2014-506192, mailed on May 7, 2015.

* cited by examiner

LONGITUDINALLY-COUPLED-RESONATOR-TYPE SURFACE ACOUSTIC WAVE FILTER

BACKGROUND OF THE INVENTION

1. Field of the Invention

The present invention relates to longitudinally-coupled-resonator-type surface acoustic wave filters and in particular relates to longitudinally-coupled-resonator-type surface acoustic wave filters in which conversion between an unbalanced signal and balanced signals is performed.

2. Description of the Related Art

In recent years, with the technological progress in mobile communication devices such as cellular phones, there has been a marked increase in the amount of data being communicated. Consequently, frequency bands are being preferentially assigned to mobile communication devices. In addition, in order to increase the speed of data communication, multiband technology in which a plurality of frequency bands are utilized is progressing.

The number of frequency filters used in a mobile communication device has been increasing in order to handle the various frequency bands. Consequently, the demand for small-sized frequency filters has been increasing and surface acoustic wave filters characterized by having a small size are widely used. Along with further reductions in size, there is also a demand for surface acoustic wave filters to have improved attenuation characteristics.

In order to improve attenuation characteristics, a longitudinally-coupled-resonator-type surface acoustic wave filter is generally used as disclosed in Japanese Unexamined Patent Application Publication No. 2006/527516. In a longitudinally-coupled-resonator-type surface acoustic wave filter, two surface acoustic wave filters are cascade connected in a direction orthogonal to a propagation direction of the surface acoustic waves.

FIG. 4 is a circuit diagram that schematically illustrates the electrode configuration and connections of a longitudinally-coupled-resonator-type surface acoustic wave filter of the related art, which is a balanced-balanced filter.

A longitudinally-coupled-resonator-type surface acoustic wave filter 4 illustrated in FIG. 4 is a balanced-balanced filter that transmits balanced signals. The longitudinally-coupled-resonator-type surface acoustic wave filter 4 includes a pair of balanced terminals 20 and a pair of balanced terminals 21. The longitudinally-coupled-resonator-type surface acoustic wave filter 4 is formed on a main surface of a piezoelectric substrate (not illustrated). The longitudinally-coupled-resonator-type surface acoustic wave filter 4 further includes a first surface acoustic wave filter unit 41, which is a first stage of a cascade connection, and a second surface acoustic wave filter unit 42, which is a second stage of the cascade connection. The first surface acoustic wave filter unit 41 and the second surface acoustic wave filter unit 42 are cascade connected with each other, whereby attenuation outside of the pass band can be increased.

The first surface acoustic wave filter unit 41 includes, on the piezoelectric substrate, a first central interdigital transducer (IDT) 411 that is arranged on a central axis x that is orthogonal to the propagation direction of surface acoustic waves, a pair of first both sides IDTs 412 that are arranged on the left and right sides of the first central IDT 411, and first reflectors 413 that are arranged such that the first both sides IDTs 412 are interposed therebetween.

The first central IDT 411 includes a pair of first central divided comb tooth shaped electrodes 411a obtained by dividing a comb tooth shaped electrode on the side close to the balanced terminals 21 along the central axis x in order to allow connection to the pair of balanced terminals 21. In addition, the first central IDT 411 includes a first central floating comb tooth shaped electrode 411b on the side spaced from the balanced terminals 21.

Similarly, the second surface acoustic wave filter unit 42 includes, on the piezoelectric substrate, a second central IDT 421 that is arranged on the central axis x so as to oppose the first central IDT 411, a pair of second both sides IDTs 422 that are arranged on the left and right sides of the second central IDT 421, and second reflectors 423 that are arranged so that the second both sides IDTs 422 are interposed therebetween.

The second central IDT 421 also includes a pair of second central divided comb tooth shaped electrodes 421a obtained by dividing a comb tooth shaped electrode on the side close to the balanced terminals 20 along the central axis x in order to allow connection to the pair of balanced terminals 20. In addition, the second central IDT 421 includes a second central floating comb tooth shaped electrode 421b on the side spaced from the balanced terminals 20.

Comb tooth shaped electrodes of the first both sides IDTs 412 and comb tooth shaped electrodes of the second both sides IDTs 422 that oppose each other along the central axis x are respectively connected to each other on the left and right sides.

In a balanced-balanced filter, balanced signals having opposite phases to each other (differential signals) are transmitted to a pair of balanced terminals. Consequently, there is no need for the first central IDT 411, which is connected to the balanced terminals 21, and the second central IDT 421, which is connected to the balanced terminals 20, to be connected to a reference potential at a comb tooth shaped electrode on the side spaced from the balanced terminals. Therefore, ground wiring lines for connecting the first central floating comb tooth shaped electrode 411b and the second floating comb tooth shaped electrode 421b to a ground potential (GND), which serves as a reference potential, can be omitted. Therefore, the longitudinally-coupled-resonator-type surface acoustic wave filter 4, which is a balanced-balanced filter, has a smaller area occupied by wiring lines and therefore is suitable for achieving size reduction.

However, the demand for unbalanced-balanced filters as frequency filters used in mobile communication devices is greater than that for balanced-balanced filters. In an unbalanced-balanced filter, one terminal is an unbalanced terminal and the other terminals are balanced terminals. An unbalanced-balanced filter is a frequency filter that performs conversion between an unbalanced signal and balanced signals. A longitudinally-coupled-resonator-type surface acoustic wave filter of the related art that is an unbalanced-balanced filter is disclosed in WO 2005/031971.

FIG. 5 is a circuit diagram that schematically illustrates the electrode configuration and connections of the longitudinally-coupled-resonator-type surface acoustic wave filter of the related art that is an unbalanced-balanced filter.

A longitudinally-coupled-resonator-type surface acoustic wave filter 5 illustrated in FIG. 5 is different from the longitudinally-coupled-resonator-type surface acoustic wave filter 4 illustrated in FIG. 4 in that it is equipped with a single unbalanced terminal 10 instead of the pair of balanced terminals 21.

A first surface acoustic wave filter unit 51 includes, on a piezoelectric substrate, a first central IDT 511 that is arranged on a central axis x that is orthogonal to a propagation direction of surface acoustic waves, a pair of first both sides IDTs 512 that are arranged on the left and right sides of the first central IDT 511, and first reflectors 513 that are arranged so that the first both sides IDTs 512 are interposed therebetween.

Comb tooth shaped electrodes of the first central IDT 511 are different from those of the first central IDT 411 illustrated in FIG. 4 and are not divided.

Similarly, a second surface acoustic wave filter unit 52 includes, on a piezoelectric substrate, a second central IDT 521 that is arranged on the central axis x so as to oppose the first central IDT 511, a pair of second both sides IDTs 522 that are arranged on the left and right sides of the second central IDT 521, and second reflectors 523 that are arranged so that the second both sides IDTs 522 are interposed therebetween.

The second central IDT 521 includes a pair of second central divided comb tooth shaped electrodes 521a obtained by dividing a comb tooth shaped electrode on the side close to the balanced terminals 20 along the central axis x. In addition, a second central floating comb tooth shaped electrode 521b on the side spaced from the balanced terminals 20 is not connected to the ground potential and is at a floating potential.

Comb tooth shaped electrodes of the first both sides IDTs 512 and comb tooth shaped electrodes of the second both sides IDTs 522 that oppose each other along the central axis x are respectively connected to each other on the left and right sides.

An unbalanced signal is transmitted to the unbalanced terminal. Consequently, the comb tooth shaped electrode on the side spaced from the unbalanced terminal has to be connected to a reference potential. Therefore, in the first central IDT 511, which is connected to the unbalanced terminal 10, a comb tooth shaped electrode on the side spaced from the unbalanced terminal 10 is connected to the ground potential.

At this time, a ground wiring line is formed on the inner side between a pair of interstage wiring lines that respectively connect the first surface acoustic wave filter unit 51 and the second surface acoustic wave filter unit 52 to each other on the left and right sides. Accordingly, the interstage wiring lines and the ground wiring line cross each other. In such a case, the interstage wiring lines and the ground wiring line are made to cross over each other three dimensionally as disclosed in WO 2006/009021.

FIG. 6 is a plan view illustrating the layout of IDTs and wiring lines formed on a main surface of a piezoelectric substrate 500 in the longitudinally-coupled-resonator-type surface acoustic wave filter 5 illustrated in FIG. 5. In FIG. 6, a wiring layer in which terminal pad electrodes and wiring lines are formed is schematically illustrated. Positions of the IDTs are illustrated with broken lines and the same symbols as in FIG. 5 are used.

In the first surface acoustic wave filter unit 51 (not illustrated), the first central IDT 511 is arranged on the central axis x. The pair of first both sides IDTs 512 are arranged on the left and right sides of the first central IDT 511.

In the second surface acoustic wave filter unit 52 (not illustrated), the second central IDT 521 being divided along the central axis x is arranged. The pair of second both sides IDTs 522 are arranged on the left and right sides of the second central IDT 521. In addition, a floating electrode pad 50e is formed on the side of the second central IDT 521 that is spaced from balanced terminal electrode pads 20e. The floating electrode pad 50e is not connected to the ground potential and is at a floating potential. The second central floating comb tooth shaped electrode 521b is connected to the floating electrode pad 50e.

An unbalanced signal wiring line 10f is formed so as to connect a single unbalanced terminal electrode pad 10e and the first central IDT 511 on the side close to the unbalanced terminal electrode pad 10e to each other.

Balanced signal wiring lines 20f are formed so as to connect the pair of balanced terminal electrode pads 20e and the second central IDT 521 on the side close to the balanced terminal electrode pads 20e to each other on the left and right sides.

Interstage wiring lines 30f are formed so as to connect the first both sides IDTs 512 and the second both sides IDTs 522, which oppose each other, to each other on the left and right sides.

Ground wiring lines 40f are formed in regions outside of the IDTs so as to connect ground terminal electrode pads 40e, the first both sides IDTs 512, which are on the side close to the unbalanced terminal electrode pad 10e and the second both sides IDTs 522, which are on the side close to the balanced terminal electrode pads 20e, to one another on the left and right sides.

In addition, in an interstage region between the first surface acoustic wave filter unit 51 and the second surface acoustic wave filter unit 52, a ground wiring line 41f is formed so as to connect the ground terminal electrode pads 40e and the first central IDT 511 on the side spaced from the unbalanced terminal electrode pad 10e to each other on the left and right sides.

In the longitudinally-coupled-resonator-type surface acoustic wave filter 5, the interstage wiring lines 30f and the ground wiring line 41f cross each other. Consequently, multilevel crossing portions 60 are provided in which the interstage wiring lines 30f and the ground wiring line 41f cross each other three dimensionally. In the multilevel crossing portions 60, insulating layers (not illustrated) are formed between an upper layer and a lower layer so that the interstage wiring lines 30f in the upper layer and the ground wiring line 41f in the lower layer do not electrically short circuit each other.

The insulating layers have to be formed over areas that are sufficiently larger than those of the regions in which the interstage wiring lines 30f and the ground wiring line 41f cross each other. Consequently, it is not possible to lay out the wiring lines with high density and reduce the area occupied by the wiring lines in the multilevel crossing portions 60. Therefore, providing the multilevel crossing portions 60 hinders size reduction of the longitudinally-coupled-resonator-type surface acoustic wave filter 5.

SUMMARY OF THE INVENTION

Accordingly, preferred embodiments of the present invention provide a small-sized longitudinally-coupled-resonator-type surface acoustic wave filter that is configured to solve the above-described problems and in which the area occupied by wiring is significantly reduced.

A longitudinally-coupled-resonator-type surface acoustic wave filter according to a certain aspect of various preferred embodiments of the present invention includes a single unbalanced terminal configured to transmit an unbalanced signal, a pair of balanced terminals configured to transmit balanced signals, a piezoelectric substrate, a first surface acoustic wave filter unit, a second surface acoustic wave filter unit, an unbalanced signal wiring line, a pair of balanced signal wiring lines, a pair of interstage wiring lines and a ground wiring line. The first surface acoustic wave filter unit includes, on the piezoelectric substrate, a first IDT arranged on a central axis that is perpendicular or substantially perpendicular to a propagation direction of surface acoustic waves, a second IDT and a third IDT that are arranged on either side of the first IDT in the propagation direction of the first IDT, and a first reflector and a second reflector that are arranged such that the second IDT and the third IDT are interposed therebetween in the propagation direction of surface acoustic waves of the first IDT. The second surface acoustic wave filter unit includes, on the piezoelectric substrate, a fourth IDT that is arranged so as to be spaced apart from the first IDT by a certain distance in a direction in which the central axis extends, a fifth IDT and a sixth IDT that are arranged on either side of the fourth IDT in the propagation direction of the surface acoustic waves of the fourth IDT, and a third reflector and a fourth reflector are arranged so that the fifth IDT and the sixth IDT are interposed therebetween in the propagation direction of the surface acoustic waves of the fourth IDT. The unbalanced signal wiring line branches from the unbalanced terminal and is connected to a comb tooth shaped electrode of the second IDT and a comb tooth shaped electrode of the third IDT on a side close to the unbalanced terminal. The pair of balanced signal wiring lines connect the balanced terminals and the second surface acoustic wave filter unit to each other. The pair of interstage wiring lines connect the first surface acoustic wave filter unit and the second surface acoustic wave filter unit to each other. The ground wiring line connects the first surface acoustic wave filter unit and the second surface acoustic wave filter unit to a ground potential. The first IDT includes a pair of first divided comb tooth shaped electrodes obtained by dividing a comb tooth shaped electrode on a side spaced from the unbalanced terminal along the central axis. The pair of first divided comb tooth shaped electrodes are connected by the interstage wiring lines to the second surface acoustic wave filter unit. A comb tooth shaped electrode of the second IDT and a comb tooth shaped electrode of the third IDT on a side spaced from the unbalanced terminal are connected to the ground wiring line, which is routed outside of the interstage wiring lines with respect to the central axis.

It is preferable that the fourth IDT include a pair of second divided comb tooth shaped electrodes obtained by dividing a comb tooth shaped electrode on a side close to the balanced terminals along the central axis. The pair of second divided comb tooth shaped electrodes are respectively connected to the balanced terminals. The pair of first divided comb tooth shaped electrodes are respectively connected to a comb tooth shaped electrode of the fifth IDT and a comb tooth shaped electrode of the sixth IDT on the side spaced from the balanced terminals by the interstage wiring lines. The ground wiring line is connected to a comb tooth shaped electrode of the fifth IDT and a comb tooth shaped electrode of the sixth IDT on a side close to the balanced terminals.

It is preferable that the fourth IDT include a pair of second divided comb tooth shaped electrodes obtained by dividing a comb tooth shaped electrode on a side spaced from the balanced terminals along the central axis. The pair of second divided comb tooth shaped electrodes are respectively connected to the pair of first divided comb tooth shaped electrodes by the interstage wiring lines. A comb tooth shaped electrode of the fifth IDT and a comb tooth shaped electrode of the sixth IDT on the side close to the balanced terminals are respectively connected to the balanced terminals. The ground wiring line is connected to a comb tooth shaped electrode of the fifth IDT and a comb tooth shaped electrode of the sixth IDT on a side spaced from the balanced terminals.

It is preferable that the pair of first divided comb tooth shaped electrodes are obtained through division such that signals therein have opposite phases.

It is preferable that the pair of second divided comb tooth shaped electrodes are obtained through division such that signals therein have opposite phases.

It is preferable that the pair of first divided comb tooth shaped electrodes each include electrode fingers. The pair of first divided comb tooth shaped electrodes preferably have the same number of electrode fingers.

It is preferable that the pair of second divided comb tooth shaped electrodes each include electrode fingers. The pair of second divided comb tooth shaped electrode preferably have the same number of electrode fingers.

It is preferable that the pair of first divided comb tooth shaped electrodes surrounded by the unbalanced signal wiring line be not connected to any of the unbalanced signal wiring line, the interstage wiring lines and the ground wiring line.

It is preferable that the pair of second divided comb tooth shaped electrodes interposed between the interstage wiring lines be not connected to any of the unbalanced signal wiring line, the interstage wiring lines and the ground wiring line.

According to various preferred embodiments of longitudinally-coupled-resonator-type surface acoustic wave filters of the present invention, since the unbalanced signal wiring line extending from a single unbalanced terminal branches into two and is connected to a comb tooth shaped electrode of the second IDT and a comb tooth shaped electrode of the third IDT on the side close to the unbalanced terminal, a ground wiring line is configured to connect to a comb tooth shaped electrode of the second IDT and a comb tooth shaped electrode of the third IDT on the side spaced from the unbalanced terminal. In addition, a pair of interstage wiring lines that connect the first surface acoustic wave filter unit and the second surface acoustic wave filter unit to each other are configured to connect to comb tooth shaped electrodes of the first IDT. Therefore, it is possible for the ground wiring line of the first surface acoustic wave filter unit to be provided outside of the pair of interstage wiring lines. Therefore, the interstage wiring lines and the ground wiring line do not cross each other and there is no need to provide multilevel crossing portions and therefore a small-sized longitudinally-coupled-resonator-type surface acoustic wave filter in which the area occupied by wiring lines has been significantly reduced is realized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred Embodiment 1

Hereafter, preferred embodiment 1 of the present invention will be described while referring to FIGS. 1 and 2. In the figures, the same symbols denote identical or corresponding portions and repeated description thereof is omitted.

Figure 1:
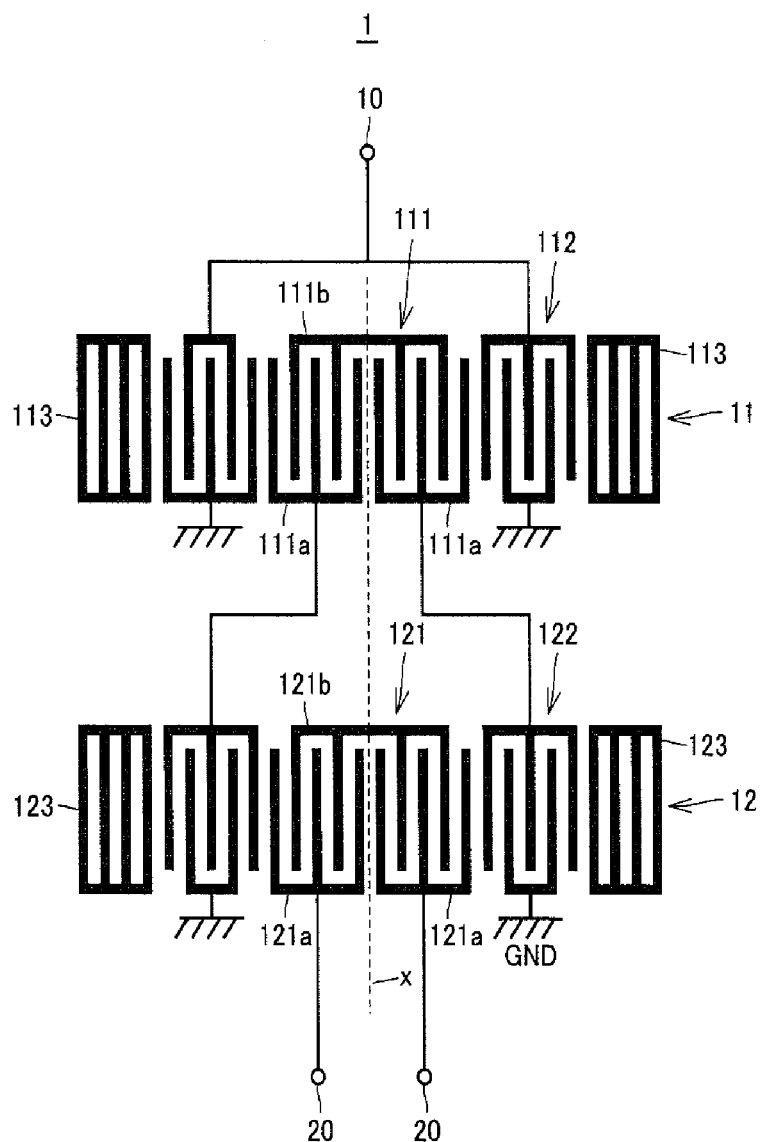
FIG. 1 is a circuit diagram schematically illustrating the electrode configuration and connections of a longitudinally-coupled-resonator-type surface acoustic wave filter according to preferred embodiment 1 of the present invention.

FIG. 1 is a circuit diagram schematically illustrating the electrode configuration and connections of a surface acoustic wave filter according to preferred embodiment 1 of the present invention.

A longitudinally-coupled-resonator-type surface acoustic wave filter 1 illustrated in FIG. 1 is an unbalanced-balanced filter including a single unbalanced terminal 10 and a pair of balanced terminals 20. The longitudinally-coupled-resonator-type surface acoustic wave filter 1 is provided on a main surface of a piezoelectric substrate (not illustrated). The longitudinally-coupled-resonator-type surface acoustic wave filter 1 further includes a first surface acoustic wave filter unit 11 and a second surface acoustic wave filter unit 12. The first surface acoustic wave filter unit 11 and the second surface acoustic wave filter unit 12 are cascade connected with each other, such that attenuation outside of the pass band is significantly increased.

The first surface acoustic wave filter unit 11 includes a first central IDT (first IDT) 111, a pair of first both sides IDTs (second IDT and third IDT) 112 and first reflectors (first reflector and second reflector) 113. The first central IDT 111 is arranged on a central axis x that is perpendicular or substantially perpendicular to the propagation direction of the surface acoustic waves on the piezoelectric substrate. The pair of first both sides IDTs 112 are arranged on the left and right sides of the first central IDT 111 (in the propagation direction of the surface acoustic waves). The first reflectors 113 are arranged such that the first both sides IDTs 112 are interposed therebetween.

The IDTs each include comb tooth shaped electrodes that are arranged so as to mesh with each other. Each comb tooth shaped electrode includes a strip-shaped busbar and electrode fingers. The electrode fingers extend from the one side of busbar in a direction perpendicular or substantially perpendicular to the busbar and are parallel or substantially parallel to one another.

The first central IDT 111 includes a pair of first central divided comb tooth shaped electrodes (first divided comb tooth shaped electrodes) 111a obtained by dividing a comb tooth shaped electrode on the side spaced from the unbalanced terminal 10 along the central axis x. In addition, the first central IDT 111 includes a first central floating comb tooth shaped electrode 111b on the side close to the unbalanced terminal 10.

Comparing the first both sides IDTs on the left and right sides, the comb tooth shaped electrodes are arranged with opposite vertical orientations with respect to a direction perpendicular or substantially perpendicular to the propagation direction of surface acoustic waves. That is, a comb tooth shaped electrode that is on the side close to the unbalanced terminal 10 on the left is arranged on the side spaced from the unbalanced terminal 10 on the right. Similarly, a comb tooth shaped electrode that is on the side spaced from the unbalanced terminal 10 on the left is arranged on the side close to the unbalanced terminal 10 on the right. This is because signals that are transmitted through interstage wiring lines that connect the first surface acoustic wave filter unit 11 and the second surface acoustic wave filter unit 12 to each other on the left and right sides are given opposite phases to each other.

Similarly, the second surface acoustic wave filter unit 12 includes, on the piezoelectric substrate, a second central IDT (fourth IDT) 121 that is arranged on the central axis x so as to face the first central IDT 111, a pair of second both sides IDTs (fifth IDT and sixth IDT) 122 that are arranged on the left and right sides of the second central IDT 121, and second reflectors (third reflector and fourth reflector) 123 that are arranged so that the second both sides IDTs 122 are interposed therebetween.

In the second central IDT 121, a comb tooth shaped electrode on the side close to the balanced terminals 20 is divided along the central axis x. A pair of second central divided comb tooth shaped electrodes (second divided comb tooth shaped electrodes) 121a obtained by dividing the comb tooth shaped electrode on the side close to the balanced terminals 20 have signals having opposite phases but the same strength. Here, it is preferable that the pair of divided comb tooth shaped electrodes constituting the second central divided comb tooth shaped electrodes 121a have the same number of electrode fingers. In addition, the second central IDT 121 includes a second central floating comb tooth shaped electrode 121b on the side spaced from the balanced terminals 20. A pair of electrode signals of the second central divided comb tooth shaped electrodes have opposite phases but the same strength. Consequently, in the second central floating comb tooth shaped electrode 121b, which faces the second central divided comb tooth shaped electrodes included in the second central IDT 121, signals of the pair of second central divided comb tooth shaped electrodes counterbalance each other and a state equivalent to being connected to a ground potential is realized.

The way in which connections are made in the thus-configured longitudinally-coupled-resonator-type surface acoustic wave filter 1 will be described below.

In the first surface acoustic wave filter unit 11, an unbalanced signal wiring line extending from the single unbalanced terminal 10 branches to the left and right and is connected on the left and right to the comb tooth shaped electrodes, which are on the side close to the unbalanced terminal 10, of the first both sides IDTs 112. The comb tooth shaped electrodes on the side spaced from the unbalanced terminal have to be connected to a reference potential. Consequently, the comb tooth shaped electrodes, which are on the side spaced from the unbalanced terminal 10, of the first both sides IDTs 112 are respectively connected on the left and right to a ground potential (GND), which serves as a reference potential.

The first central divided comb tooth shaped electrodes 111a and the comb tooth shaped electrodes, which are on the side spaced from the balanced terminals 20, of the second both sides IDTs 122 are respectively connected to each other on the left and right. The first central floating comb tooth shaped electrode 111b is not connected to the ground potential and is at a floating potential. In the second both sides IDTs 122, the comb tooth shaped electrodes on the side close to the balanced terminals 20 are connected to the ground potential on the left and right sides.

Balanced signal wiring lines extending from the pair of balanced terminals 20 are respectively connected on the left and right to the second central divided comb tooth shaped electrodes 121a of the second surface acoustic wave filter unit 12. The comb tooth shaped electrode on the side spaced from the balanced terminals does not need to be connected to a reference potential. Consequently, the second central floating comb tooth shaped electrode 121b is not connected to any of the balanced signal wiring lines, the to-be-described interstage wiring lines and ground wiring lines and is at a floating potential.

The layout of IDTs and wiring lines of the longitudinally-coupled-resonator-type surface acoustic wave filter 1 having the above-described connections will be described hereafter while referring to FIG. 2.

Figure 2:
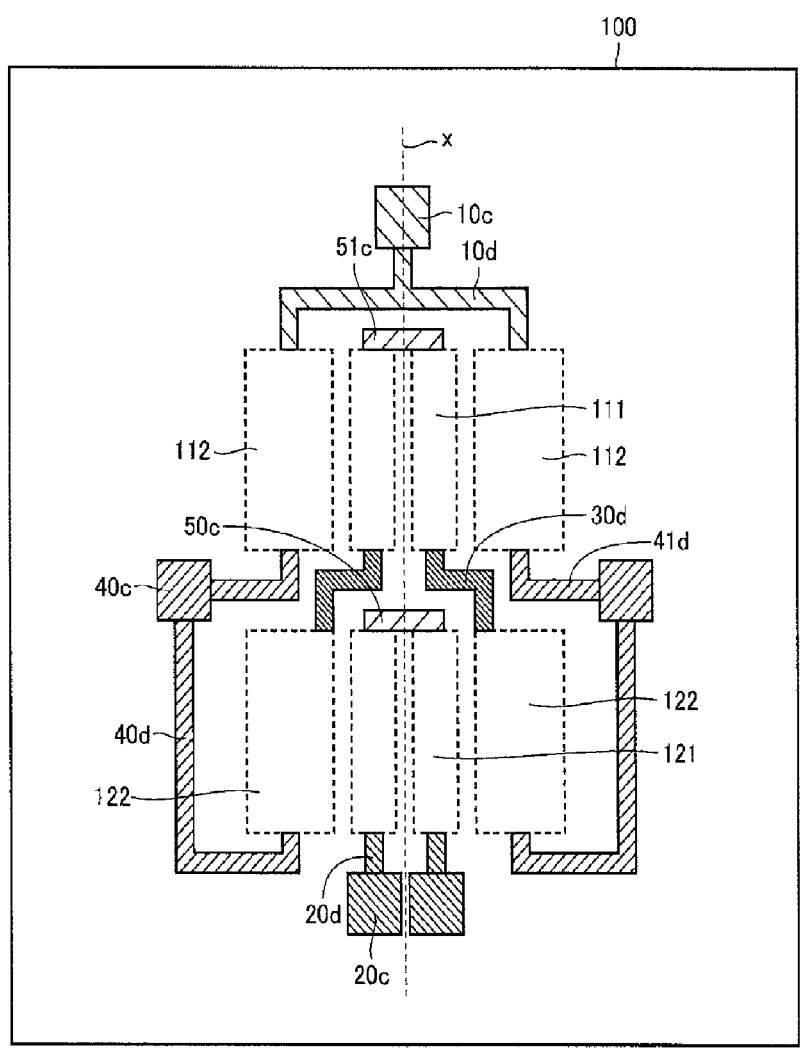
FIG. 2 is a plan view illustrating the layout of IDTs and wiring lines provided on a main surface of a piezoelectric substrate in the longitudinally-coupled-resonator-type surface acoustic wave filter illustrated in FIG. 1.

FIG. 2 is a plan view illustrating the layout of IDTs and wiring lines provided on a main surface of a piezoelectric substrate 100 in the longitudinally-coupled-resonator-type surface acoustic wave filter 1 illustrated in FIG. 1. In FIG. 2, a wiring layer in which terminal pad electrodes and wiring lines are provided is schematically illustrated. Positions of IDTs are illustrated with broken lines and the same symbols as in FIG. 1 are used.

The terminal electrode pads and IDTs are axially symmetrically arranged about the central axis x which is perpendicular or substantially perpendicular to a direction in which surface acoustic waves propagate on a main surface of the piezoelectric substrate 100. In addition, the wiring lines are also axially symmetrical about the central axis x so as to have the same or substantially the same lengths.

In the first surface acoustic wave filter unit 11 (not illustrated), the first central IDT 111 being divided along the central axis x is arranged. The pair of first both sides IDTs 112 are arranged on the left and right sides of the first central IDT 111. In addition, a floating electrode pad 51c is provided on the side of the first central IDT 111 close to an unbalanced terminal electrode pad 10c. The floating electrode pad 51c is not connected to the ground potential and is at a floating potential. The first central floating comb tooth shaped electrode 111b is connected to the floating electrode pad 51c.

In the second surface acoustic wave filter unit 12 (not illustrated), the second central IDT 121 being divided along the central axis x is arranged. The pair of second both sides IDTs 122 are arranged on the left and right sides of the second central IDT 121. In addition, a floating electrode pad 50c is provided on the side spaced from balanced terminal electrode pads 20c. The floating electrode pad 50c is not connected to the ground potential and is at a floating potential. The second central floating comb tooth shaped electrode 121b is connected to the floating electrode pad 50c.

An unbalanced signal wiring line 10d branches to the left and right so as to connect the single unbalanced terminal electrode pad 10c and sides of the first both sides IDTs 112 close to the unbalanced terminal electrode pad 10c.

Balanced signal wiring lines 20d connect on the left and right sides the pair of balanced terminal electrode pads 20c and a side of the divided second central IDT 121 close to the balanced terminal electrode pads 20c.

Interstage wiring lines 30e respectively connect on the left and right a side of the first central IDT 111 spaced from the unbalanced terminal electrode pad 10c and sides of the second both sides IDTs 122 spaced from the balanced terminal electrode pads 20c.

Ground wiring lines 40d respectively connect on the left and right ground terminal electrode pads 40c and sides of the second both sides IDTs 122 close to the balanced terminal electrode pads 20c in a region outside of the IDTs.

In addition, in an interstage region between the first surface acoustic wave filter unit 11 and the second surface acoustic wave filter unit 12, ground wiring lines 41d connect on the left and right the ground terminal electrode pads 40c and the sides of the first both sides IDTs 112 spaced from the unbalanced terminal electrode pad 10c to each other.

As has been described above, in the longitudinally-coupled-resonator-type surface acoustic wave filter 1, the unbalanced signal wiring line 10d branches to the left and right and is connected to the comb tooth shaped electrodes of the first both sides IDTs 112 on the side close to the unbalanced terminal electrode pad 10c. Consequently, the ground wiring lines 40d are respectively arranged on the left and right so as to extend from the comb tooth shaped electrodes of the first central IDTs 112 on the side spaced from the unbalanced terminal electrode pad 10c. Along with this, the interstage wiring lines 30d extend from the comb tooth shaped electrodes of the first central IDT 111. Therefore, in the interstage region, the ground wiring lines 41d are provided on the outside with respect to the pair of interstage wiring lines 30d. Therefore, the interstage wiring lines 30d and the ground wiring lines 41d do not cross each other and multilevel crossing portions do not have to be provided. Therefore, a small-sized longitudinally-coupled-resonator-type surface acoustic wave filter in which the area occupied by wiring lines has been reduced is realized.

In addition, the unbalanced signal wiring line 10d branches from the unbalanced terminal electrode pad 10c and is connected to the comb tooth shaped electrodes of the second IDT and the third IDT (first both sides IDTs) 112 on the side close to the unbalanced terminal electrode pad 10c. The floating electrode pad 51c of the first IDT (first central IDT) 111 surrounded by the unbalanced signal wiring line 10d virtually obtains the action of a ground potential without being connected to the ground potential. Consequently, there is no need for the floating electrode pad 51c to be connected to the ground potential by a wiring line. Therefore, there is no need to make a wiring line connected to the floating electrode pad 51c and the branching unbalanced signal wiring line 10d cross each other. Accordingly, a small-sized longitudinally-coupled-resonator-type surface acoustic wave filter that performs conversion between an unbalanced signal and balanced signals is provided.

In reality, in the case where a piezoelectric substrate having a die size of, for example, approximately 600 µm×800 µm is used, it is possible to reduce the area of the main surface of the piezoelectric substrate in the longitudinally-coupled-resonator-type surface acoustic wave filter 1 according to preferred embodiment 1 of the present invention by approximately 10% compared with the related art.

Preferred Embodiment 2

IDTs preferably are arranged and wiring lines preferably are laid out such that multilevel crossing portions need not be provided for the interstage wiring lines and the ground wiring lines in ways other than that described in preferred embodiment 1 of the present invention. Hereafter, preferred embodiment 2 of the present invention will be described while referring to FIG. 3.

Figure 3:
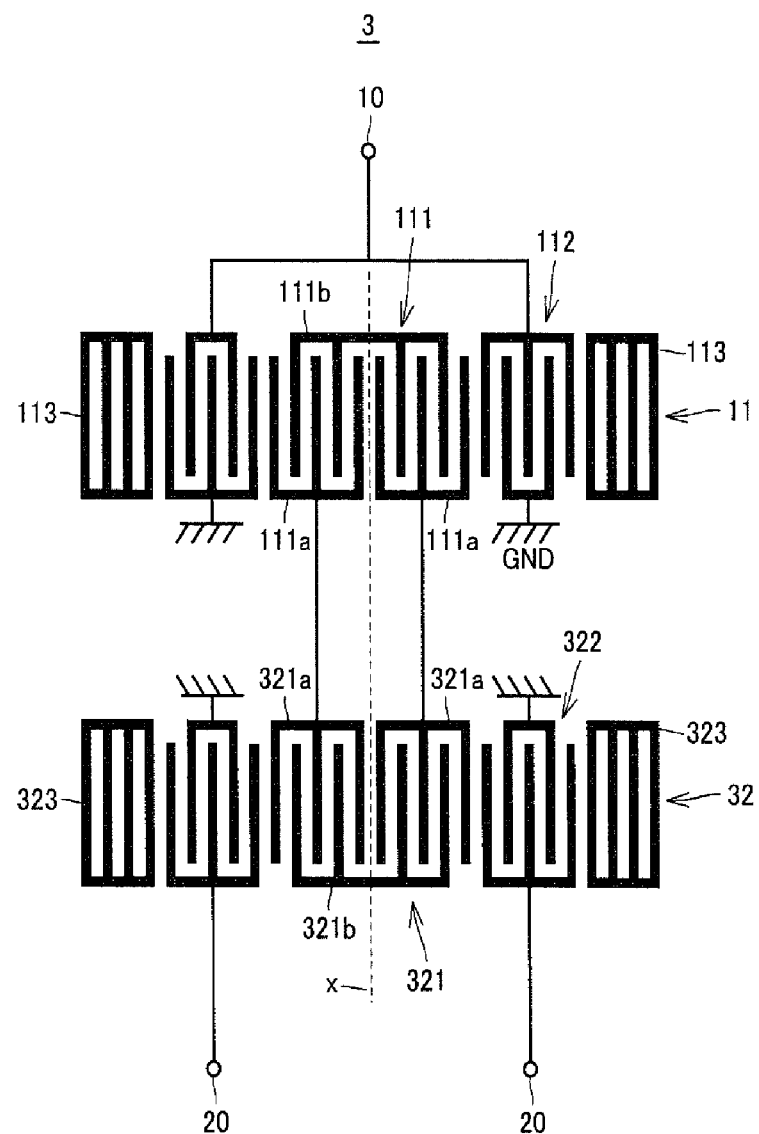
FIG. 3 is a circuit diagram that schematically illustrates the electrode configuration and connections of a longitudinally-coupled-resonator-type surface acoustic wave filter according to preferred embodiment 2 of the present invention.
Figure 4:
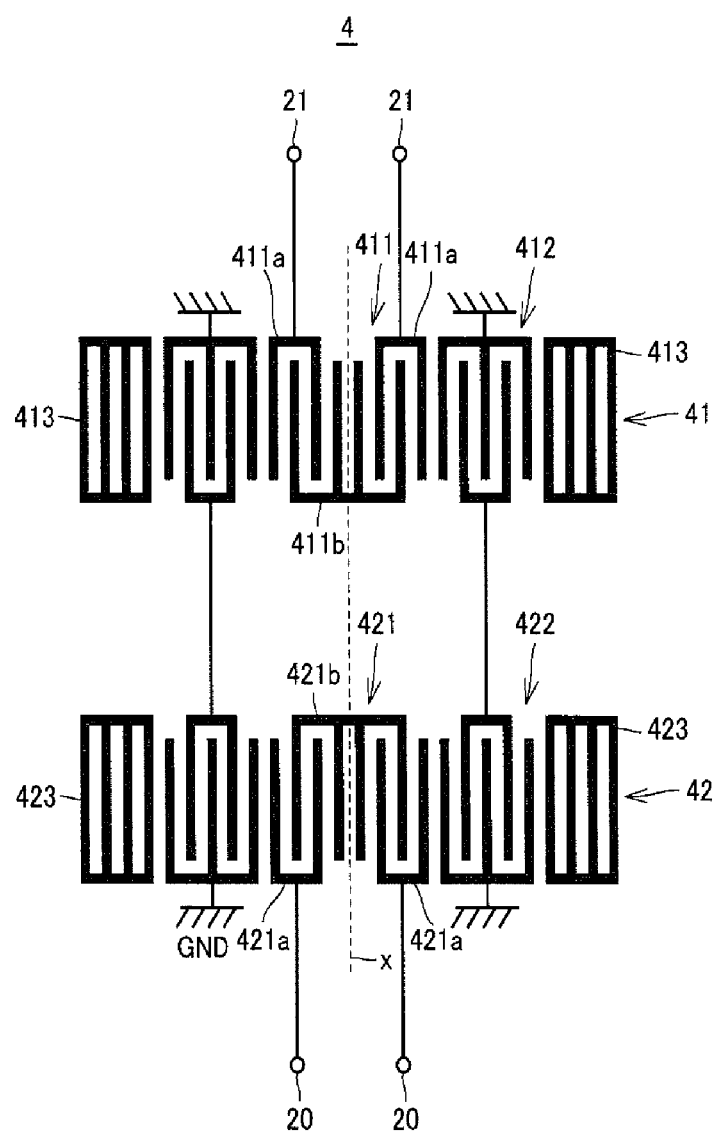
FIG. 4 is a circuit diagram that schematically illustrates the electrode configuration and connections of a longitudinally-coupled-resonator-type surface acoustic wave filter, which is a balanced-balanced filter.
Figure 5:
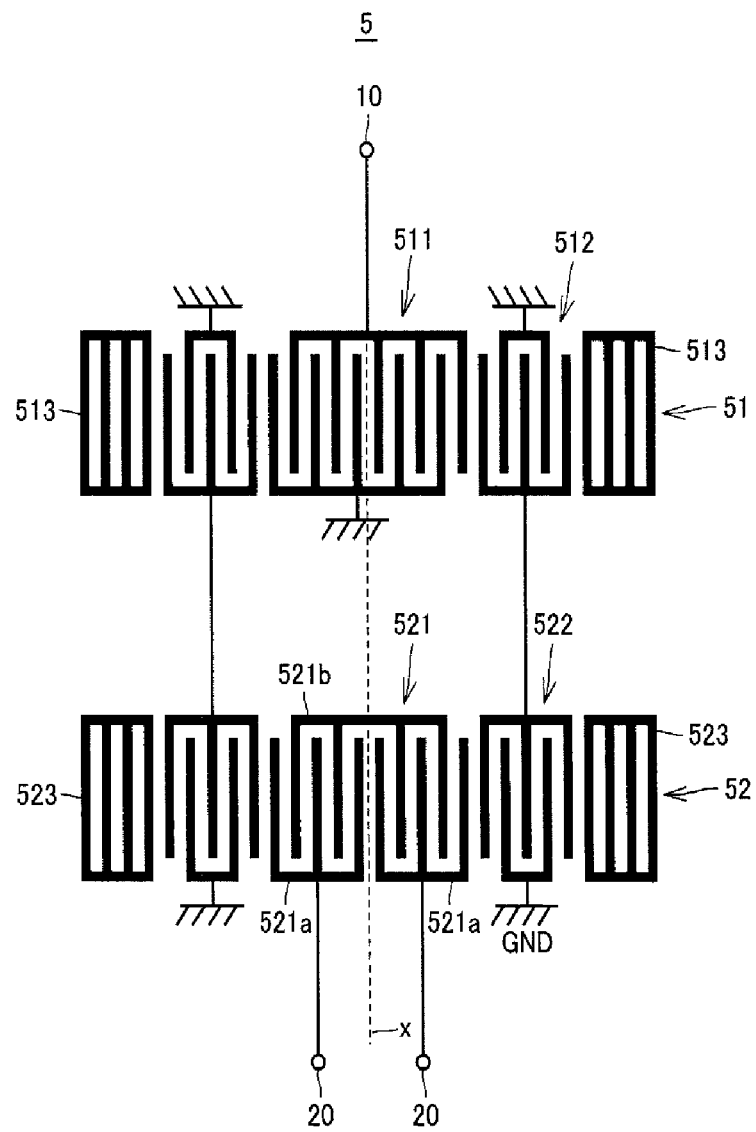
FIG. 5 is a circuit diagram that illustrates the electrode configuration and connections of a longitudinally-coupled-resonator-type surface acoustic wave filter of the related art, which is an unbalanced-balanced filter.
Figure 6:
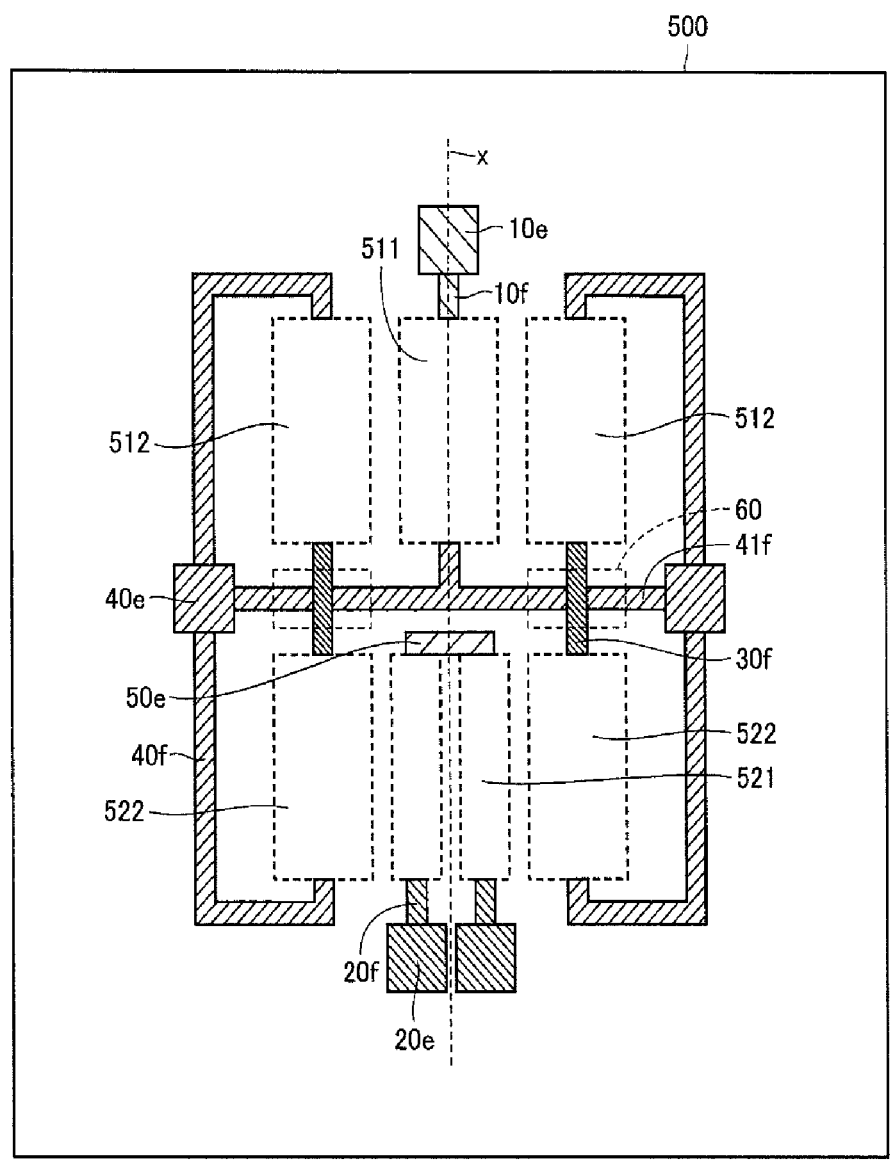
FIG. 6 is a plan view illustrating the layout of IDTs and wiring lines provided on a main surface of a piezoelectric substrate in the longitudinally-coupled-resonator-type surface acoustic wave filter illustrated in FIG. 5.

FIG. 3 is a circuit diagram that illustrates the electrode configuration and connections of a longitudinally-coupled-resonator-type surface acoustic wave filter according to preferred embodiment 2 of the present invention.

In a longitudinally-coupled-resonator-type surface acoustic wave filter 3 illustrated in FIG. 3, a first surface acoustic wave filter unit 11 is the same as that of the longitudinally-coupled-resonator-type surface acoustic wave filter 1 illustrated in FIG. 1 but a second surface acoustic wave filter unit is different. In addition, constituent elements that are the same as those of the longitudinally-coupled-resonator-type surface acoustic wave filter 1 will be denoted by the same symbols and repeated description thereof will be avoided.

A second surface acoustic wave filter unit 32 includes a second central IDT (fourth IDT) 321, a pair of second both sides IDTs (fifth IDT and sixth IDT) 322 and second reflectors (third reflector and fourth reflector) 323. The second central IDT 321 is arranged on the central axis x so as to face the first central IDT 111 on the piezoelectric substrate. The pair of second both sides IDTs 322 are arranged on the left and right sides of the second central IDT 321. The second reflectors 323 are arranged so that the second both sides IDTs 322 are interposed therebetween.

The second central IDT 321 includes a pair of second central divided comb tooth shaped electrodes (second divided comb tooth shaped electrodes) 321a obtained by dividing a comb tooth shaped electrode on the side spaced from the balanced terminals 20 along the central axis x. In addition, the second central IDT 321 includes a second central floating comb tooth shaped electrode 321b on the side close to the balanced terminals 20. The second central floating comb tooth shaped electrode 321b is not connected to the ground potential and is at a floating potential.

The first central divided comb tooth shaped electrodes 111a and the second central divided comb tooth shaped electrodes 321a are connected to each other on the left and right sides.

Comb tooth shaped electrodes of the first both sides IDTs 112 and comb tooth shaped electrodes of the second both sides IDT 322 that oppose each other along the central axis x are connected to the ground potential on the left and right sides.

As has been described above, in preferred embodiment 2 as well, ground wiring lines of the first surface acoustic wave filter unit 11 preferably are provided outside of the pair of interstage wiring lines. Therefore, the interstage wiring lines and the ground wiring lines do not cross each other and multilevel crossing portions do not have to be provided. Therefore, a small-sized longitudinally-coupled-resonator-type surface acoustic wave filter in which the area occupied by wiring lines has been significantly reduced is realized.

In addition, in preferred embodiment 1 and preferred embodiment 2 of the present invention, a case in which just one pair of both sides IDTs are arranged has been described, but the present invention is not limited to this. In a case where two or more pairs of both sides IDTs are provided, the present invention can be applied by providing an unbalanced signal wiring line that branches to the left and right from the unbalanced terminal 10 to provide wiring lines of equal lengths.

In addition, in FIG. 1 and FIG. 3, a case is illustrated in which the first both sides IDTs 112 preferably are configured with opposite vertical orientations on the left and right and the second both sides IDTs 122 and the second both sides IDTs 322 are arranged with the same vertical orientations on the left and right, but the present invention is not limited to this. In FIG. 2, the orientations of the both sides IDTs may be appropriately decided upon such that signals of the same phase flow through the unbalanced signal wiring line 10d that branches to the left and right and signals of opposite phases flow through the pair of balanced signal wiring lines 20d. For example, the first both sides IDTs may be arranged with the same vertical orientation on the left and right and the second both sides IDTs on the left and right may be arranged with opposite orientations on the left and right.

In addition, comb tooth shaped electrodes not connected to a signal wiring line and on the side spaced from a terminal are all connected to the ground potential. However, even if comb tooth shaped electrodes of the first surface acoustic wave filter unit and the second surface acoustic wave filter unit are simply connected to each other on the left and right there is no problem in terms of operation.

The configurations of the comb tooth shaped electrodes illustrated in preferred embodiment 1 and preferred embodiment 2 of the present invention are merely exemplary. The spacing between the comb tooth shaped electrodes, and the number of, the spacing between and the intersection width and so forth of electrode fingers that make up the comb tooth shaped electrodes are all capable of being appropriately adjusted. In addition, the first reflector and the second reflector do not directly affect the way in which the interstage wiring lines and the ground wiring lines are configured and arranged. Therefore, the shapes of the reflectors are also capable of being appropriately adjusted.

The presently disclosed preferred embodiments are illustrative in all points and should not be considered as limiting. The scope of the present invention is not defined by the above description but rather by the scope of the claims and it is intended that equivalents to the scope of the claims and all modifications within the scope of the claims be included within the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A longitudinally-coupled-resonator-type surface acoustic wave filter that performs conversion between an unbalanced signal and balanced signals, comprising:
   a single unbalanced terminal configured to transmit the unbalanced signal;
   a pair of balanced terminals configured to transmit the balanced signals;
   a piezoelectric substrate;
   a first surface acoustic wave filter unit that includes, on the piezoelectric substrate, a first IDT arranged on a central axis that is perpendicular or substantially perpendicular to a propagation direction of surface acoustic waves, a second IDT and a third IDT that are arranged on either side of the first IDT in the propagation direction of the first IDT, and a first reflector and a second reflector that are arranged such that the second IDT and the third IDT are interposed therebetween in the propagation direction of the first IDT;
   a second surface acoustic wave filter unit that includes, on the piezoelectric substrate, a fourth IDT that is arranged so as to be spaced apart from the first IDT by a certain distance in a direction in which the central axis extends, a fifth IDT and a sixth IDT that are arranged on either side of the fourth IDT in the propagation direction of the surface acoustic waves of the fourth IDT, and a third reflector and a fourth reflector that are arranged so that the fifth IDT and the sixth IDT are interposed therebetween in the propagation direction of the surface acoustic waves of the fourth IDT;

an unbalanced signal wiring line that branches from the unbalanced terminal and is connected to a comb tooth shaped electrode of the second IDT and a comb tooth shaped electrode of the third IDT on a side adjacent to the unbalanced terminal;

a pair of balanced signal wiring lines that connect the balanced terminals and the second surface acoustic wave filter unit to each other;

a pair of interstage wiring lines that connect the first surface acoustic wave filter unit and the second surface acoustic wave filter unit to each other; and ground wiring lines that connect the first surface acoustic wave filter unit and the second surface acoustic wave filter unit to a ground potential; wherein the first IDT includes a pair of first divided comb tooth shaped electrodes defined by a divided comb tooth shaped electrode on a side spaced from the unbalanced terminal along the central axis;

the pair of first divided comb tooth shaped electrodes are connected to the second surface acoustic wave filter unit by the interstage wiring lines; and a comb tooth shaped electrode of the second IDT and a comb tooth shaped electrode of the third IDT on a side spaced from the unbalanced terminal are connected to the ground wiring lines, which are routed outside of and around the interstage wiring lines, the fifth IDT, and the sixth IDT with respect to the central axis.

2. The longitudinally-coupled-resonator-type surface acoustic wave filter according to claim 1, wherein the fourth IDT includes a pair of second divided comb tooth shaped electrodes defined by a divided comb tooth shaped electrode on a side adjacent to the balanced terminals along the central axis;

the pair of second divided comb tooth shaped electrodes are respectively connected to the balanced terminals;

the pair of first divided comb tooth shaped electrodes are respectively connected to a comb tooth shaped electrode of the fifth IDT and a comb tooth shaped electrode of the sixth IDT on the side spaced from the balanced terminals by the interstage wiring lines; and the ground wiring lines are connected to a comb tooth shaped electrode of the fifth IDT and a comb tooth shaped electrode of the sixth IDT on a side adjacent to the balanced terminals.

3. The longitudinally-coupled-resonator-type surface acoustic wave filter according to claim 2, wherein the pair of second divided comb tooth shaped electrodes have a divided structure such that signals therein have opposite phases.

4. The longitudinally-coupled-resonator-type surface acoustic wave filter according to claim 2, wherein
the pair of second divided comb tooth shaped electrodes each include electrode fingers;
the pair of second divided comb tooth shaped electrodes have a same number of electrode fingers.

5. The longitudinally-coupled-resonator-type surface acoustic wave filter according to claim 2, wherein the pair of second divided comb tooth shaped electrodes is interdigitated with another comb tooth shaped electrode that is interposed between the interstage wiring lines and is not connected to any of the unbalanced signal wiring line, the interstage wiring lines, and the ground wiring lines.

6. The longitudinally-coupled-resonator-type surface acoustic wave filter according to claim 1, wherein the pair of first divided comb tooth shaped electrodes have a divided structure such that signals therein have opposite phases.

7. The longitudinally-coupled-resonator-type surface acoustic wave filter according to claim 1, wherein
the pair of first divided comb tooth shaped electrodes each include electrode fingers; and
the pair of first divided comb tooth shaped electrodes have a same number of electrode fingers.

8. The longitudinally-coupled-resonator-type surface acoustic wave filter according to claim 1, wherein the pair of first divided comb tooth shaped electrodes is interdigitated with another comb tooth shaped electrode that is surrounded by the unbalanced signal wiring line and is not connected to any of the unbalanced signal wiring line, the interstage wiring lines, and the ground wiring lines.

9. The longitudinally-coupled-resonator-type surface acoustic wave filter according to claim 1, wherein the first surface acoustic wave filter unit and the second surface acoustic wave filter unit are cascade connected with each other.

10. The longitudinally-coupled-resonator-type surface acoustic wave filter according to claim 1, wherein the first surface acoustic wave filter unit includes a floating comb tooth shaped electrode.

11. The longitudinally-coupled-resonator-type surface acoustic wave filter according to claim 1, further comprising a floating electrode pad provided on the piezoelectric substrate.

12. The longitudinally-coupled-resonator-type surface acoustic wave filter according to claim 1, wherein the interstage wiring lines and the ground wiring lines do not cross each other.

13. The longitudinally-coupled-resonator-type surface acoustic wave filter according to claim 1, wherein the second surface acoustic wave filter unit includes a floating comb tooth shaped electrode.

* * * * *